United States Patent [19]

Litvak

[11] Patent Number: 5,695,660
[45] Date of Patent: Dec. 9, 1997

[54] OPTICAL TECHNIQUES OF MEASURING ENDPOINT DURING THE PROCESSING OF MATERIAL LAYERS IN AN OPTICALLY HOSTILE ENVIRONMENT

[75] Inventor: Herbert E. Litvak, Cupertino, Calif.

[73] Assignee: Luxtron Corporation, Santa Clara, Calif.

[21] Appl. No.: 615,417

[22] Filed: Mar. 14, 1996

Related U.S. Application Data

[63] Continuation of Ser. No. 122,207, Sep. 16, 1993, Pat. No. 5,499,733, which is a continuation-in-part of Ser. No. 946,942, Sep. 17, 1992, abandoned.

[51] Int. Cl.$^6$ .................. B24D 17/00; G01N 21/00
[52] U.S. Cl. ........................... 216/85; 216/89
[58] Field of Search .................. 216/85, 88, 89; 156/626.1, 636.1

[56] References Cited

U.S. PATENT DOCUMENTS

| | | | |
|---|---|---|---|
| 3,623,813 | 11/1971 | Hacman et al. | 356/108 |
| 3,771,880 | 11/1973 | Bennett | 356/446 |
| 4,450,652 | 5/1984 | Walsh | 451/7 |
| 4,462,860 | 7/1984 | Szmanda | 156/626.1 |
| 4,569,717 | 2/1986 | Ohgami et al. | 216/85 |
| 4,611,919 | 9/1986 | Brooks, Jr. et al. | 356/357 |
| 4,618,262 | 10/1986 | Maydan et al. | 356/357 |
| 4,717,446 | 1/1988 | Nagy et al. | 156/626.1 |
| 4,753,530 | 6/1988 | Knight et al. | 356/73 |
| 4,767,495 | 8/1988 | Nishioka | 156/626.1 |
| 4,851,311 | 7/1989 | Millis et al. | 156/626.1 X |
| 4,953,982 | 9/1990 | Ebbing et al. | 356/357 |
| 4,998,021 | 3/1991 | Mimasaka | 356/357 X |
| 5,036,015 | 7/1991 | Sandhu | 156/626.1 X |
| 5,046,849 | 9/1991 | Severin et al. | 356/357 |
| 5,081,796 | 1/1992 | Schultz | 451/8 |
| 5,189,490 | 2/1993 | Shetty et al. | 356/371 |
| 5,190,614 | 3/1993 | Leach et al. | 216/59 |
| 5,196,353 | 3/1993 | Sandhu | 437/8 |
| 5,229,303 | 7/1993 | Donnelly, Jr. et al. | 437/8 X |
| 5,240,552 | 8/1993 | Yu et al. | 156/636.1 |
| 5,270,222 | 12/1993 | Moslehi | 437/8 |

FOREIGN PATENT DOCUMENTS

| | | |
|---|---|---|
| 0466114 | 3/1950 | Canada. |
| WO9118322 | 4/1991 | European Pat. Off.. |
| 60-23858 | 2/1985 | Japan. |
| 190728 | 2/1987 | Japan. |

OTHER PUBLICATIONS

Marcoux, P.J., "Methods of Endpoint Detection for Plasma Etching," *Solid-State Technology*, vol. 24, No. 4, Port Washington, N.Y., U.S., pp. 115–122 (Apr. 1981).

"RD27270 GaAs Film Monitoring," *Research Disclosure*, p. 755 (Dec. 1986).

Severin et al., "Applications of Light Guides in Process Control," *Philips Technical Review*, vol. 43, No. 3, Jan. 1987, pp. 58–60.

*Primary Examiner*—Thi Dang
*Attorney, Agent, or Firm*—Majestic, Parsons, Siebert & Hsue

[57] ABSTRACT

In a process of selectively removing material from an exposed layer carried by a substrate, a technique for determining endpoint by monitoring the intensity of a radiation beam that is passed through the substrate and any intervening layers to be reflected off the layer being processed. This monitoring technique is used during photoresist developing, wet etching, and mechanical planarization and polishing during the manufacture of integrated circuits on semiconductor wafers, flat panel displays on glass substrates, and similar articles. Planarization and polishing processes are alternatively monitored by monitoring temperature.

46 Claims, 8 Drawing Sheets

OPTICAL TECHNIQUES OF MEASURING ENDPOINT DURING THE PROCESSING OF MATERIAL LAYERS IN AN OPTICALLY HOSTILE ENVIRONMENT

CROSS-REFERENCE TO RELATED APPLICATIONS

This is a continuation of application Ser. No. 08/122,207, filed Sep. 16, 1993, now U.S. Pat. No. 5,499,733, which in turn is a continuation-in-part of application Ser. No. 07/946, 942, filed Sep. 17, 1992, now abandoned. The disclosures of this patent and application are hereby incorporated herein by this reference.

This application is also related to two patent applications, Ser. Nos. 07/896,132 now U.S. Pat. No. 5,308,447, and 07/896,137, now abandoned but published under the Patent Cooperation Treaty (PCT) as No. WO 93/25893 the disclosures of which are incorporated herein by this reference.

BACKGROUND OF THE INVENTION

This invention relates generally to process control, and, more specifically, to the processing of a layer through a surface thereof and the detection of an endpoint to the process by optical techniques.

There are many situations where such processing takes place. One class of such situations occurs in the manufacturing of flat panel liquid crystal displays and integrated circuits on semiconductor wafers. In each, several processing steps include forming a layer of material and subsequently removing either all of the layer or a portion of it according to a pattern. As part of this process, it must be accurately determined when just enough of the layer has been removed; i.e., to detect an endpoint of the removal operation. The endpoint determination is then used to monitor the progress of the process and/or to control the process, such as by automatically terminating the specific processing operation being monitored.

At several stages in the manufacture of display panels or circuits on a semiconductor wafer, a mask is formed of photoresist material. The resulting mask is used to limit processing of a layer covered by the mask to a patterned area. The mask is formed by exposing the photoresist layer to light in the desired pattern, followed by developing the photoresist layer through application of a developer solution to it. With the usual photoresist material, the exposed regions are removed during the development process to expose the layer below. The time at which the underlying layer first becomes exposed by removal of photoresist material is termed the "breakthrough" or "endpoint." The development process is allowed to continue for a period of time after breakthrough is first detected, the end of that period of time being the end of the development process, termed its "process end" (or "step end" if there is more than one step in the overall process).

Because of various processing and environmental variations that exist among semiconductor wafers and flat panel display substrates, the development process is monitored in order to determine when breakthrough occurs. A beam of light having a finite bandwidth is directed against the photoresist layer from the side of the wafer or other substrate that carries the layer. A light signal reflected from the layer is then usually detected, although light transmitted through the structure is sometimes used. A resulting electrical signal is then processed to determine when breakthrough occurs.

In a common arrangement, light reflected from both the top and bottom surfaces of the substantially transparent photoresist layer interfere at, and is detected by, a photodetector. As a portion of the photoresist layer is removed during the development process, the detected intensity of the reflected light cycles between one or more maxima and minima as the material removal alters the relative phase between the two interfering beams. At breakthrough, however, this signal variation ends, a condition which is detected by analyzing the photodetector output signal. Development is then usually allowed to proceed for a fixed or calculated time after detection of breakthrough, at which point the development is terminated by rinsing away the development solution or by some other means.

Wet etching processes, wherein substantially transparent material layers other than photoresist material are etched away, also use such a breakthrough detection process. Where the layer being etched is opaque, however, the photodetector signal remains essentially level until breakthrough occurs, at which time the optical signal either suddenly rises or falls to indicate that breakthrough has occurred. These breakthrough detection techniques are used when either an entire layer is being etched away or when only a portion according to a pattern designated by a mask is removed by etching through openings of a mask that is resistant to the etchant.

In both of the photoresist development and wet etching processes, unless the article is totally immersed in the development or etching solution, such a solution is applied to the exposed layer by spraying, pouring or the like. This can interfere with the optical signal path used for endpoint monitoring and thus give inaccurate results, if endpoint can be determined at all. A mist or fog is often created in the space adjacent the layer being processed, particularly when the development or etching solution is applied by spraying. This has the effect of blocking or scattering the endpoint detecting beam, an effect which can change over time. If the processing occurs in a chamber having transparent walls or a viewing window, vapor of the solution can condense on an inside surface in a manner to attenuate any light beam passing through it. Since the wafer or other substrate is usually positioned horizontally, liquid can also puddle on the exposed surface of the layer being treated, thus affecting the light beam passing through. Liquid puddling can occur as a result of spraying or pouring the solution onto the layer surface. As an additional complication, these light beam attenuation and scattering effects can change over time.

Another difficult situation for optical endpoint detection exists during mechanical removal of material. A mechanical removal step is not uncommonly performed during both integrated circuit and flat panel display processing, for example. One specific application is to form a planar surface on a layer that has been deposited over a very uneven surface resulting from prior processing steps. An uneven exposed surface of the deposited layer is then planarized. Other times, it is desired to form a layer of substantially uniform thickness on a smooth underlying surface. In either case, the layer of material is initially formed with a thickness much greater than that desired, and part of it is removed by a mechanically abrasive process. In another specific application, the layer is either entirely removed, if the underlying surface is smooth, or removed in only its thinnest regions when the underlying surface is quite irregular. Accurate detection of the endpoint of these processes is, of course, desired.

Another mechanical removal process that is often performed is polishing. Microscopic variations of a surface are removed by polishing the surface. It is desired to be able to accurately detect when the surface roughness has been removed in order to avoid removal of more material than necessary. Polishing is performed on bare substrates and on layers of material formed on the substrates.

Both of the planarization and polishing processes are typically performed by holding the substrate up-side-down by means of a vacuum chuck or the like, and then rotating the chuck and substrate while the surface being removed is held in an abrasive fluid against a moving block. The size of particles in the abrasive fluid, the force with which the surface is urged against the block and the speed of rotation are adjusted for the specific planarization or polishing operation. Access from this surface, in order to optically monitor its progress with known techniques, is not possible during such an operation.

Therefore, it is a general object of the present invention to provide optical techniques for monitoring processing endpoints under those conditions described above and others presenting similar difficulties.

It is another object of the present invention to provide improved techniques for monitoring microscopic roughness and other variations in a surface.

It is another object of the present invention to provide an improved method of manufacturing large, flat liquid crystal display panels with an improved yield.

SUMMARY OF THE INVENTION

The various aspects of the present invention provide real-time, in-situ measurement of a parameter that is changing during a process being performed on a wafer or other substrate, such as the aforementioned planarization or polishing, either for the purpose of just monitoring the process or for automatically controlling the process in response to the measurements taking place. The measured parameters include the following: an amount of a layer of material that has been removed, a remaining thickness of a layer, a rate of removal of material from the layer, a degree of planarization, a breakthrough of a layer being removed in whole or part, a degree of surface roughness and surface temperature. These parameters are measured by any one of a number of methods, such as the following: observation through the wafer or other substrate, observation from a front side of the wafer or other substrate when the surface of interest is not optically blocked from its exposed side, by optical reflectance, by light scattering, by measuring the emissivity of the surface being processed, and by measuring a relevant temperature.

According to a principal aspect of the present invention, briefly and generally, an endpoint detecting electromagnetic radiation beam is directed through the substrate, reflected off the layer being processed and then directed back through the substrate before being detected. In this way, the beam avoids having to pass through any mist, fog or liquid layer that exists on the side of the substrate carrying the layer being processed. A wavelength range of the radiation beam is chosen to be one to which the substrate is substantially transparent. The substrate of liquid crystal display panels is usually glass, so visible or near infrared radiation wavelengths are used. In the case of semiconductor wafers, infrared wavelengths are used.

It is usual to detect endpoint by reflecting radiation directly off the exposed layer being processed and thus avoid passing through the substrate. The additional interfaces of the substrate and any other material layers carried on the substrate under the exposed layer being processed present potential problems. Each such interface reflects a portion of the radiation beam and thus makes it difficult to monitor the endpoint signal from only one or two of potentially many reflections that cannot be separated from one another. However, contrary to what might be initially thought, it has been found that endpoint can be detected from this complicated reflected radiation signal.

Additional objects, features and advantages of the present invention will become apparent from the following description of its preferred embodiments, which description should be taken in conjunction with the accompanying drawings.

DESCRIPTION OF THE PREFERRED EMBODIMENTS

Figure 1:
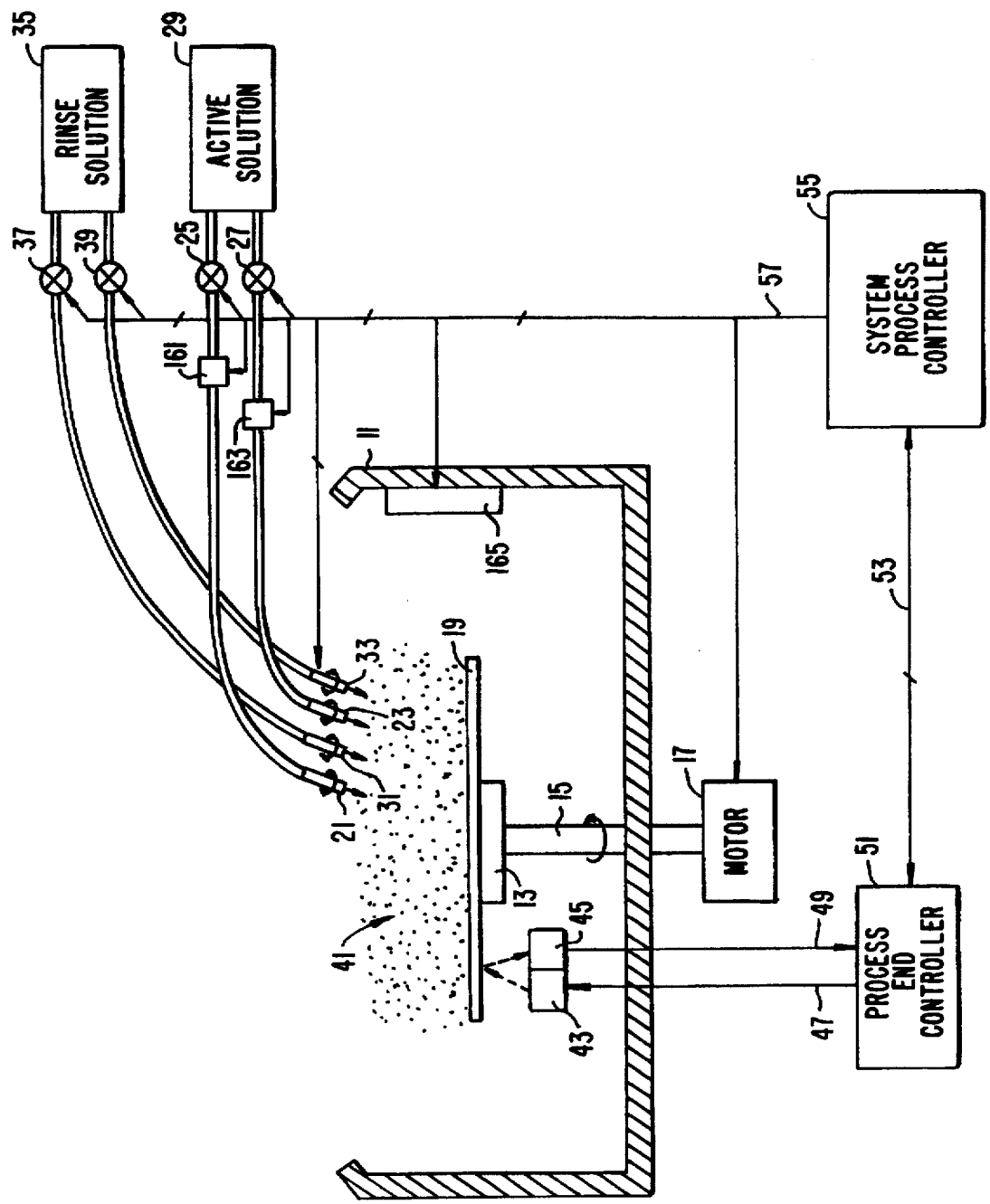
FIG. 1 schematically illustrates the use of one type of equipment to perform one process step in manufacturing a flat panel display or a large integrated circuit wafer.

Referring initially to FIG. 1, an example of an implementation of the present invention employs commonly used equipment for photoresist development as one step in a number of sequential steps implemented to manufacture flat panel displays or electronic circuits on a large semiconductor wafer. A liquid enclosure 11 contains a support 13 that is rotated through a shaft 15 by a motor 17 positioned outside of the enclosure 11. A flat panel display or a semiconductor wafer 19 that is being processed is carried by the rotating support 13.

At the point in the multi-step processing where the current step is being carried out, a patterning step has been accomplished on the layer to be processed. If a photoresist material, the layer has been exposed to a light pattern corresponding to the physical pattern to be left after development. If a wet etching step is being performed on the layer, which may be a dielectric, metal or some other material, a mask has already been formed on the exposed surface of the layer.

A photoresist developer or etching solution is generally applied to the layer by spraying, although other techniques can be used as well. In this case, two spray nozzles 21 and 23 are positioned at different distances from a center of rotation and over the article 19 being processed. Flow through each of the nozzles 21 and 23 is controlled by respective valves 25 and 27. The developer or etch solution is stored in a container 29. Also positioned above the article 19 are two additional nozzles 31 and 33 for applying to the article 19 a rinse solution from a container 35 through respective valves 37 and 39.

The development or etch begins by applying a respective developer or etch solution from the nozzles 21 and 23, either intermittently or continuously, until it is detected by the technique described hereinafter that the process has been completed, referred to as the "process end." At that point, further development or etching is prevented by terminating application of fresh solution to the article 19 and rinsing off existing solution from the surface. Of course, any number of spray nozzles may be used as desired, two such nozzles 21 and 23 being illustrated in this example. Similarly, any number of rinse nozzles, from one to many, may be utilized, two such nozzles 31 and 33 being illustrated in this example.

In order to monitor the progress of either the photoresist development or etching taking place on the exposed surface of the article 19, one or more photodetectors is positioned under the article 19. FIG. 1 shows a light source 43 which directs an electromagnetic radiation beam upward through the bottom of the substrate. This beam interacts with the internal structure of the article in ways described below with respect to FIGS. 3-6. A photodetector 45 receives the beam after reflection by this structure. A signal from the photodetector 45 is connected through a circuit 49 to a controller 51. The radiation source 43 is driven by a signal in a circuit 47, from the controller 51.

The detected light signal is processed by the controller 51 in order to determine when the development or etching process has resulted in removal of material from the layer in the region being monitored to the point of a "breakthrough" of the layer. The controller 51 also determines the time in which the process will be terminated such as by initiating a spray of the rinsing solution. This process end time is determined from the measured breakthrough time by either adding a fixed time to the breakthrough time, adding a percentage of the process time of the breakthrough, or other similar type of technique. The calculated process end time is communicated over the bus 53 to a process controller 55. The process controller is an industrial control computer that generates control signals in circuits 57 for controlling operation of the motor 17, the liquid valves 25, 27, 37 and 39, and other normal machine control functions.

Application of the solution to the exposed layer portions on the top of the article usually creates some volume of liquid on the layer. Any endpoint monitoring beam must pass through this volume if it is to monitor the layer being processed. When the liquid is applied by a spray, the form of application illustrated in FIG. 1, a mist or fog 41 may be created in the volume immediately above the article 19. Such a mist, as well as liquid which may collect in puddles on the top surface, attenuates and/or scatters, and in some cases can completely block, any end point detecting radiation beam that is directed through this volume. In addition, the effects on such a radiation beam can change during the process as the density of the mist or depth of the puddles change, thus giving signal changes that may falsely indicate endpoint or make it difficult to determine it. The noise created by these effects can overwhelm the endpoint signal being monitored. On the other hand, monitoring the layer from the bottom of the article 19, rather than from the top of the article, avoids these effects.

Figure 2:
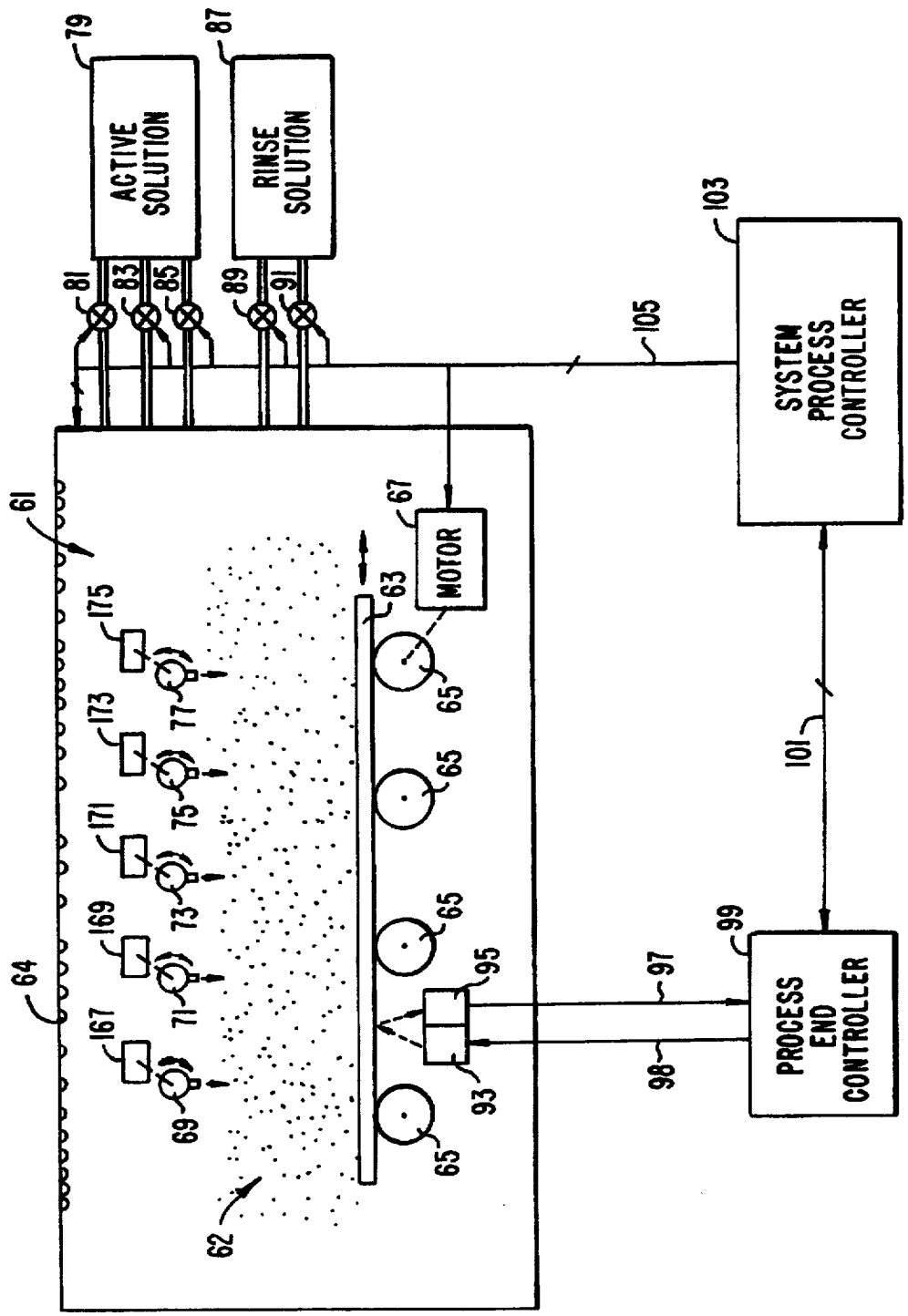
FIG. 2 schematically illustrates the use of a second type of equipment for performing substantially the same process step as the equipment of FIG. 1.

Use of a different type of system for the same processing is described with respect to FIG. 2. An enclosed chamber 61 carries a flat panel display or large semiconductor wafer 63 on a series of rollers 65. A motor 67 drives the rollers 65 in order to move the article 63 back and forth during processing. At least several liquid conduits 69, 71, 73, 75 and 77 extend across the article 63 in one direction above it. Each of these conduits contains nozzles periodically spaced along the chamber length for directing developer solution, etch solution, or rinse solution onto the top surface of the panel or wafer 63. Three of these conduits, for example, can be supplied from a reservoir 79 of developer or etch solution through individual electrically controlled valves 81, 83 and 85. Similarly, the remaining two conduits can be supplied by a rinse solution from a reservoir 87 through individual electrically controlled valves 89 and 91.

Although the liquid is illustrated to be applied by spraying to the layer being processed, other techniques can also be used. One alternative is to pour the liquid onto the horizontal surface of the article. In either case, the liquid can interfere with an endpoint monitoring radiation beam directed against the layer from its exposed, top surface. Shown in FIG. 2 is a mist 62 that results from the spraying operation, as in the case of the FIG. 1 embodiment. Also, this mist can deposit, and any liquid vapor condense, into liquid bubbles 64 on an inside of a top wall of the chamber 61. This additionally interferes with a monitoring radiation beam when the beam is directed into the chamber through a transparent window in the top wall.

In order to avoid these adverse effects on a monitoring radiation beam, a photodetector 95 is shown positioned below the article 63 and connected through a circuit 97 to a process end controller 99. A light source 93 is driven by the controller over a circuit 98. Breakthrough of the layer on a top side of the substrate is determined by the controller 99. The controller 99 then calculates a time in which the process should be terminated by stopping application of the developer or etching solution to the article 63 and commencing application of rinse solution. This process end time is communicated by circuits 101 to an overall process controlling computer 103. The controller 103 controls functions through signals in circuits 105, such as operation of the motor 67 and the opening and closing of the valves 81, 83, 85, 89 and 91.

There are many process parameters which can be changed in the systems of FIG. 1 and 2 by the respective system controllers 55 and 103. Several of these are illustrated in these figures. The temperature of a developer or etchant is controllable in the FIG. 1 system by heater/cooler units 161 and 163 that can independently control the temperature of the liquid supplied through respective nozzles 21 and 23. The temperature of the active liquid applied to different areas of the article 19 is controlled from the controller 55. Similarly, a heater 165 is indicated for heating the article itself to control the developing or etching function. The heater can be of radiant type and oriented to affect some areas of the article 19 differently than others. This also is under the control of the controller 55. Control of the motor 17 (FIG. 1) and motors 17 and 67 (FIG. 2) have already been described. In the system of FIG. 2, the extent of linear motion of the article 63 can also be controlled in addition to its speed.

Another class of process variations includes rotating the spray nozzle. Referring to FIG. 1, each of the active solution nozzles 21 and 23, and optionally, the rinse solution nozzles 31 and 33, can be made to pivot in response to signals in the control computer bus 57 to direct liquid spray to controlled areas of the spinning article 19. A similar approach can be applied in the system of FIG. 2, wherein motor sources 167, 169, 171, 173 and 175, under control of signals of the bus 105, rotate respective liquid conduits 69, 71, 73, 75 and 77 about their longitudinal axes to redirect the spray nozzles. Further, each of the spray nozzles may be individually controlled in set the flow through them. Thus, both the flow rate and direction of individual nozzles in the systems of FIG. 1 and FIG. 2 can be controlled. Also, the composition of the developer or etchant can be controlled by mixing two or more components of the composition in response to the signals from one of the system controllers 55 or 103.

Figure 3:
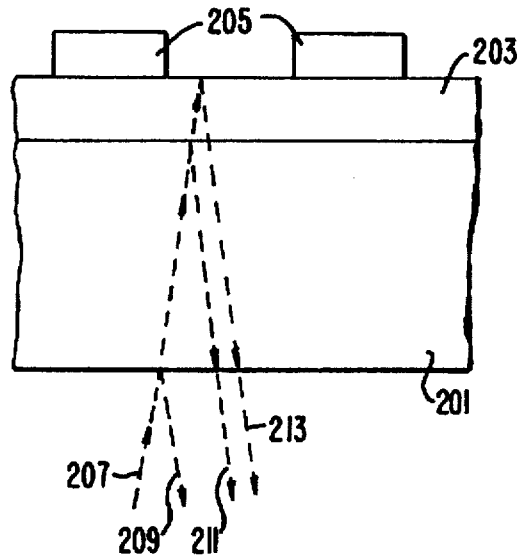
FIGS. 3–6 schematically illustrate, in cross-sectional views, exemplary radiation ray reflections in articles being processed by the equipment of either of FIGS. 1 or 2.
Figure 4:
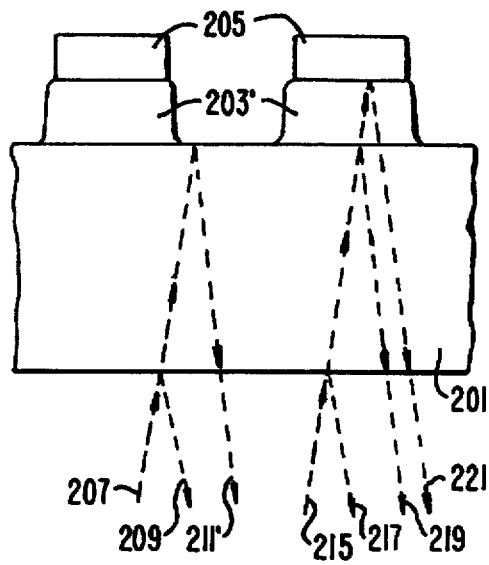

Referring to FIG. 3, a cross-sectional view of an example article 19(FIG. 1) or 63 (FIG. 2) is shown. A substrate 201 carries a layer 203 to be processed. A mask 205 overlies a layer 203 in regions of the layer to be retained. Portions of the layer 203 that are exposed through the mask 205 will receive the material removing liquid. FIG. 4 shows the state of the structure of FIG. 3 near the end of a process of removing the exposed portions of the layer 203, leaving a portion 203' under the mask 205. The purpose of the endpoint detection is to provide an indication of when the process has initially broken through the layer 203, thus exposing the substrate 201.

Operation of the endpoint detection of the present invention can be understood by an illustration showing the various reflections of an optical ray. With reference to FIG. 3, a radiation ray 207 is part of the incident beam from the radiation source 43 (FIG. 1) or 93 (FIG. 2). These beams are of a wavelength to which the substrate 201 is substantially transparent. A portion of the intensity of the ray 207 is reflected at a bottom interface of the substrate 201 into a ray 209. The remaining intensity proceeds through the substrate until it reaches an interface between the substrate 201 and the layer 203, at which point at least a portion of the intensity is reflected into another ray 211. If the material of the layer 203 is at least partially transparent to the wavelength of radiation of the ray 207, it will proceed through it to the top surface of the layer 203 and some of that ray is reflected back down through the substrate 201 as indicated by a ray 213. If the material of the layer 203 is substantially opaque, there will be substantially no intensity in the ray 213 and the intensity in the ray 211 will certainly be different.

After the material removing process is near its end, as indicated by FIG. 4, the reflected ray 213 disappears and the intensity of the ray 211 may be changed significantly, as indicated by a ray 211'. In regions under the mask 205, however, the effect of another ray 215 will have the same reflected rays 217, 219 and 221 corresponding respectively to reflected rays 209, 211 and 213 of FIG. 3. The photodetector 45 (FIG. 1) or 95 (FIG. 2) receives all of the reflected rays indicated in FIGS. 3 and 4.

The sources 43 (FIG. 1) and 93 (FIG. 2) of the sensor radiation may be light emitting diodes (LEDs). In the case of manufacturing a large area of flat panel display, the substrate 201 is most commonly a glass material so radiation within a visible or near infrared portion of the electromagnetic energy spectrum is used. An LED having an output within a range of approximately 0.3 to 2.0 microns can be used, an LED having an infrared wavelength of about 0.9 microns being particularly convenient. In the case of manufacturing integrated circuits, the substrate 201 is most commonly a silicon material which is generally transparent to radiation in the infrared region of the electromagnetic energy spectrum in excess of about 1.2 microns. LEDs are readily available with outputs in the range of about 1.2 to 1.5 microns. As an alternative to the use of an LED, particularly when visible wavelengths can be used, an incandescent light source with a narrow bandpass filter, or a laser source, may be employed instead.

Figure 7:
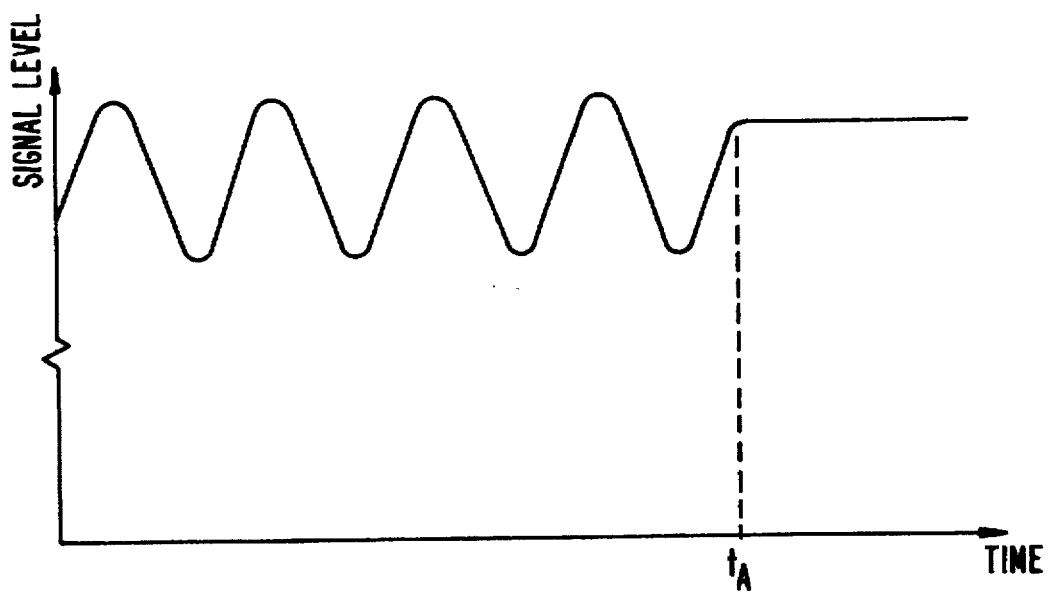
FIGS. 7 and 8 show two types of endpoint detection signals that exist in the equipment of either of FIGS. 1 or 2.

An example output signal of either of the photodetectors 45 (FIG. 1) or 95 (FIG. 2) is shown in FIG. 7 where the layer 203 of FIG. 3 and 4 is transparent to the radiation being directed up through the structure. An interference between the light rays 211 and 213 (FIG. 3) causes the photodetector output to swing between a maximum and a minimum as the thickness of the layer 203 is reduced during the material removing process. At a point of breakthrough of the layer, at time $t_A$, this changing signal component ends and the photodetector output then remains constant. A detection of when the condition at time $t_A$ occurs is accomplished by either of the respective process end controllers 51 (FIG. 1) or 99 (FIG. 2). Preferred algorithms for detecting endpoint are given in the aforementioned co-pending patent application Ser. No. 07/896,137.

Figure 8:
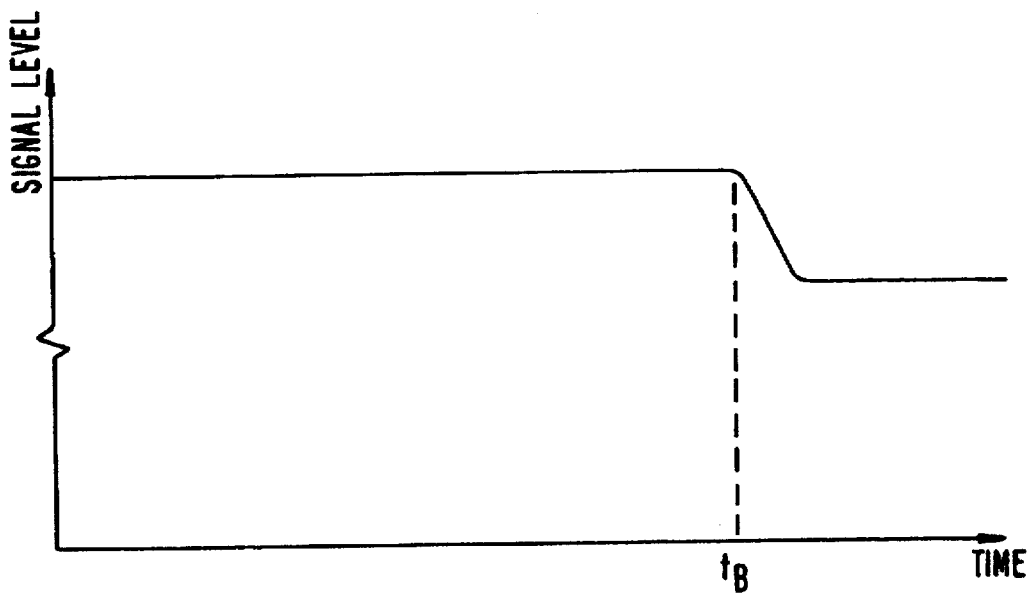

If the material of the layer 203 is opaque to the wavelength of the radiation being directed up through the article structure, there can be no interference between rays reflected from the bottom and top interfaces of the layer. A reflection from the top interface into a beam 213 of FIG. 3 does not exist. Therefore, as indicated by FIG. 8, a relatively constant signal output of the respective photo-detector is experienced until a time $t_B$ at endpoint. At that time, the intensity of the ray 211 decreases sharply as indicated by the photodetector output signal of FIG. 8. As breakthrough occurs, radiation will pass out of the top of the article and thus leave less of the intensity reflected back to the photodetector. This signal transition at breakthrough is also detected by the respective process end controllers 51 (FIG. 1) or 99 (FIG. 2) in accordance with the techniques described in the aforementioned co-pending patent application Ser. No. 07/896,137.

Because of the multiple reflections that are received by the photodetector, the percentage of the total signal change indicated in FIGS. 7 and 8 can be quite low. That is, a constant signal level is outputted from the photodetector as a result of the reflections from various interfaces that do not change during the material removing process. It is thus a relatively small change in the total light signal intensity which is being monitored in order to determine a processing endpoint. Since noise also exists in the signal, one might think that proper endpoint detection under the condition of multiple reflections cannot be made. However, this is not the case.

Indeed, in actual practice, there may be many more reflections than shown in the simplified case of FIGS. 3 and 4. This is because there may be additional layers between the substrate and the top layer being processed. The method being described is suitable only, of course, if these intermediate layers are sufficiently transparent to the radiation to allow a signal to be reflected from the top layer and out of the bottom of the article. In an example of FIG. 5, a layer 223 that is at least partially transparent is interposed between the substrate 201 and the top layer 203 that is being processed. The material in the layer 223 is usually different than that in either of the substrate 201 or the layer 203, generally also having a different refractive index. In such a case, there is a reflection 225 from a first interface, 227 from the next highest and 229 from a top surface of the layer 203. The reflection 225 is one more than exists in the situation of FIG. 3 without the layer 223. And even further such different material intermediate layers will often exist, increasing further the number of interfaces between layers that provide a partial reflection.

Figure 5:
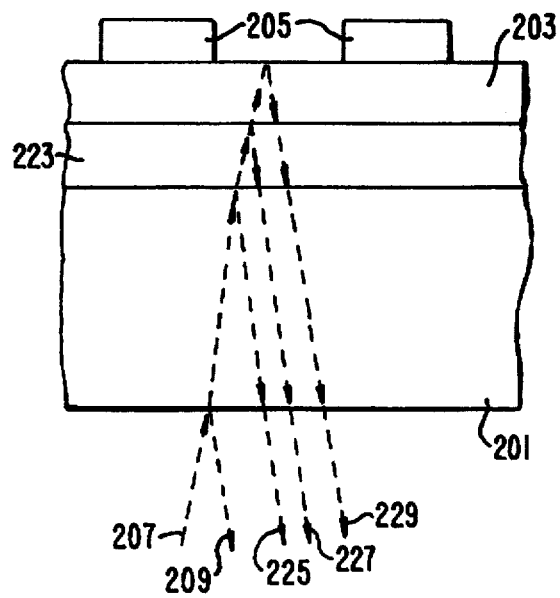
Figure 6:
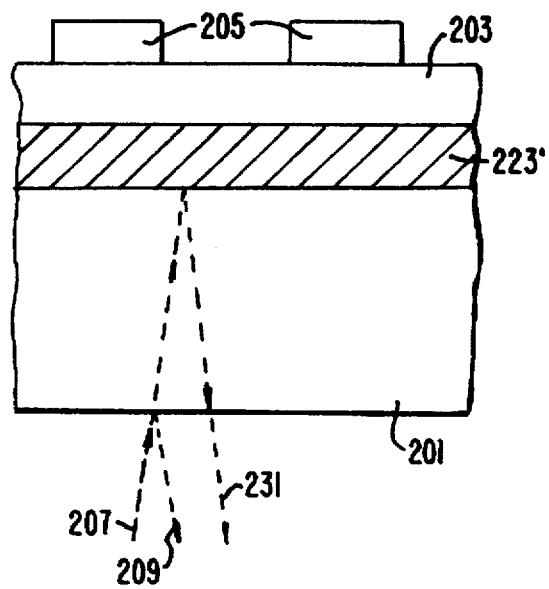

Even if the layer 223 includes opaque portions, as indicated by a layer portion 223' of FIG. 6, the technique of the present invention is operable if that layer includes transparent portions, such as layer portion 223 shown in FIG. 55. For example, the layer 223' can include patterned metal strips where there is a great deal of open space between the opaque strips that is filled with a substantially transparent dielectric material. Such open space would exist either behind the section of the layer 223' shown on FIG. 6, into the page, or in front of it, out of the page. The radiation beam will be reflected from the opaque portions of the layer 223' as indicated by a ray 231, without changing during the processing of the layer 203. However, in between the opaque portions of the layer 223', the reflection shown in FIG. 5 will be seen by the photodetector. FIGS. 5 and 6 can represent two sections through a single structure including alternating opaque metal strips 223' and transparent dielectric insulating material 223 in a single layer. Even in such a situation, a relatively small signal variation that indicates endpoint is detectable from the overall reflected signal.

The monitoring techniques of the present invention have been described above with respect to a liquid material removal system, where they are particularly useful. However, the techniques can also be used to monitor either a vapor or plasma material removal operation. In order to avoid the endpoint monitoring radiation signals being swamped by that generated by the plasma in a plasma etching system, either a wavelength range different from that of the plasma radiation emission is chosen for use in the monitoring system or the plasma radiation is physically blocked from the photodetector(s) of the monitoring system. Such a blockage can exist, for example, when the endpoint system operates through a substrate from a side opposite to that carrying an opaque layer, the opaque layer being positioned between the plasma emissions originating from the opposite substrate side and the endpoint detector(s).

Mechanical operations on a top layer of an integrated circuit or display panel structure can also be monitored in a similar manner, as explained below with respect to the embodiments of FIGS. 9 and 10. Planarization of a surface is one example of a mechanical material removal application. It is desired to measure the degree of planarization and determine as an endpoint when the raised areas on the surface have been removed. Another example is the mechanical removal of a certain thickness of a uniform thickness film, and even the entire layer, instead of using chemical etching. The film thickness, amount of film removed, film removal rate and breakthrough are among parameters that are desired to be measured. The thickness of an unprocessed substrate can also be mechanically reduced in such a manner. A film of non-uniform thickness is sometimes removed to the point where only its thinnest portions are totally removed, such a breakthrough desirably being detected. Additionally, a substrate is often polished smooth on one side before any other processing steps are carried out to form an electronic circuit structure on that side. Top surfaces of structures formed on a substrate are also sometimes polished. In polishing operations, an endpoint to be detected is when the rough surface first becomes smooth, in order to avoid removal of any more material than is necessary.

To perform each of the foregoing and similar mechanical operations, an abrasive fluid is usually held in contact with the surface being processed by an opaque block. Frequently, the abrasive fluid contains a chemical agent that converts the surface to be planarized into a more easily removed chemical form. The planarization process is then referred to as chemical-mechanical planarization, or "CMP". Optical monitoring of the material removal operation is thus rendered impractical, if not impossible, from the side of the substrate carrying the surface being worked upon. Because of this, non-optical techniques are currently employed when it is desired to monitor the effect of the polishing. However, optical monitoring is made possible with the present invention by establishing an optical communication path through the substrate, from its backside to the surface being operated upon. Various optical properties of the surface or film of interest may thus be monitored during various types of material removal operations, including the optical properties of reflectance, scattering, emissivity, refractive index, and polarization. Optical temperature sensing may also be performed in order to detect endpoints of planarization and polishing operations by detecting a changed level of friction between the abrasive medium and the exposed surface.

Figure 9:
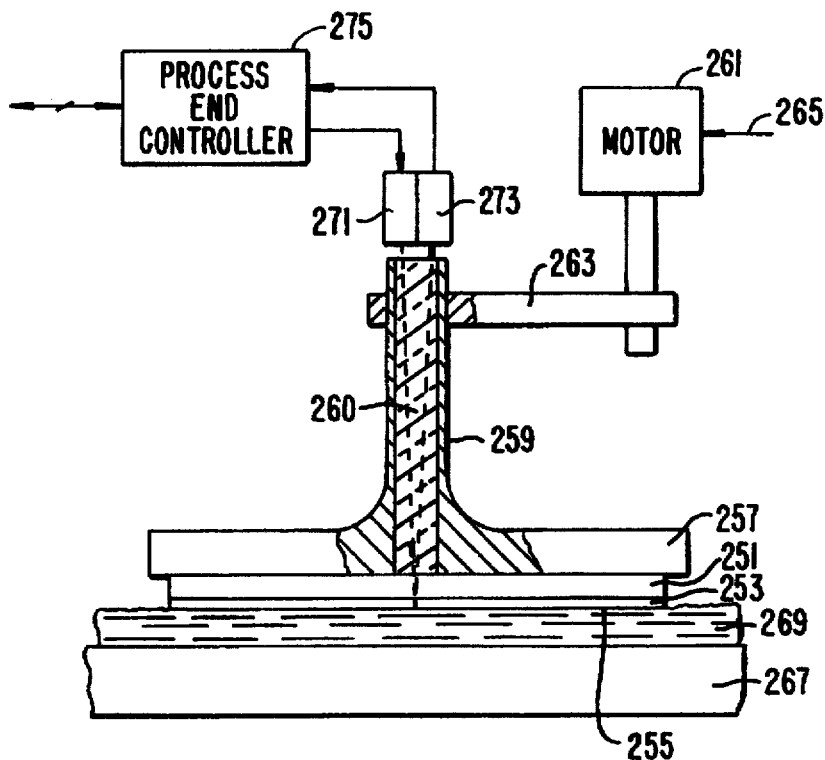
FIGS. 9 and 10 illustrate two optical configurations for endpoint detection during a mechanical material removal operation.

FIG. 9 provides an illustration of a system for monitoring such properties from the backside of a substrate being processed. A substrate 251 is shown to be carrying a layer 253 whose open surface 255 is being polished but a process could alternatively be performed on the substrate itself. As in the prior embodiments, there will usually be other layers between the substrate and the layer being processed but these are not shown in FIG. 9, for simplicity. The substrate is rotated by its attachment to a rotating polishing wheel 257. This attachment is usually provided by a vacuum chuck (not shown). The wheel 257 has a shaft 259 attached at its center of rotation. The shaft 259 is rotated by a motor 261 through a suitable drive linkage 263. A signal in a circuit 265 controls operation of the motor 261. The spinning substrate 251 and the outer surface 255 are urged against an optically opaque polishing block 267 with an abrasive polishing fluid layer 269 therebetween.

In order to monitor some of the previously listed optical parameters of the layer 252 or the surface 255, an LED or other light source 271 directs a beam of radiation down a center of the shaft 259 and against a back surface of the wafer 251. Reflected radiation components are received by a photodetector 273. An internal passageway of the shaft 259 may be left open or, preferably, a cylinder 260 of radiation transparent glass, quartz or similar substance is inserted within the shaft 259. A process end controller 275 receives the electrical signal output of the detector 273 and controls the light source 271, as in the prior embodiments.

In the case where the layer 253 is transparent, light reflected from both interfaces of the layer 253 interferes at the detector 273 to generate a component of the detector output signal that varies in the manner shown in FIG. 7 as the thickness of the portion of the layer 253 being monitored is reduced by the process. If the monitored portion of the layer is removed entirely, that signal variation ends at time $t_A$, in the same manner as described above with respect to the previous breakthrough embodiments. It is of advantage to accurately detect such a breakthrough under at least two conditions. One condition is where the layer has a uniform thickness and is being entirely removed. Another is where the layer is formed on an irregular surface and it is desired to detect when a breakthrough first occurs on the highest levels of the underlying rough surface. In either case, it is desired to terminate removal of material immediately after this condition is detected.

Additionally, the changing thickness of a transparent layer 253 may be monitored, in cases where it is not intended to completely remove it anywhere. That is, the technique is useful when the process is terminated prior to the time $t_A$(FIG. 7) being reached. Useful information is obtained by counting the number of cycles of the varying signal output of the photodetector 273 that occur from the beginning of the process. This is proportional to the amount of material that has been removed. The operation may then be stopped after a certain thickness of the layer 253 has been removed, as determined by the optical monitoring technique being described. Of course, if the beginning thickness of the film is known, then its remaining thickness can be measured in real time. Also, if a rate of material removal is useful, this can be measured by counting the number of cycles per unit time of the varying signal of FIG. 7.

If the layer 253 is opaque to the radiation being used, its thickness obviously cannot be monitored in this way. However, breakthrough can be detected in the same manner as described above with respect to the photodetector output signal curve of FIG. 8.

FIG. 9 illustrates an application of the present invention to monitoring the effect upon the layer 253. The technique is also useful to monitor the exposed surface of the substrate 251 alone, before any layers are formed on it. If the thickness of the substrate is being monitored, radiation from the source 271 that is reflected off both sides of the substrate will generate a varying signal of the type of FIG. 7 at the output of the photodetector 273. The signal cycles can be counted during the process in order to monitor the amount of material that is being removed from the substrate surface. If the substrate surface is being polished, a degree of light scattering of that surface is monitored instead, as discussed below with respect to FIGS. 15–19.

A modified apparatus for monitoring a material removal operation, in the ways described above, is shown in FIG. 10, wherein counterparts of elements of FIG. 9 are identified by the same reference numbers but with a prime (') added. Rather than directing the radiation through the center of the shaft 259', the embodiment of FIG. 10 utilizes an eccentrically placed radiation transparent window 281. The window 281 can extend completely around the polishing wheel 257' in a circular shape but most commonly will extend only a portion of the distance therearound. In the latter case, the radiation beams will be periodically interrupted, so a shaft angular position detector 283 is included to gate the output signal of the photodetector 273' so that it is used only when the window 281 is positioned under the LED 271' and photodetector 273'.

Figure 10:
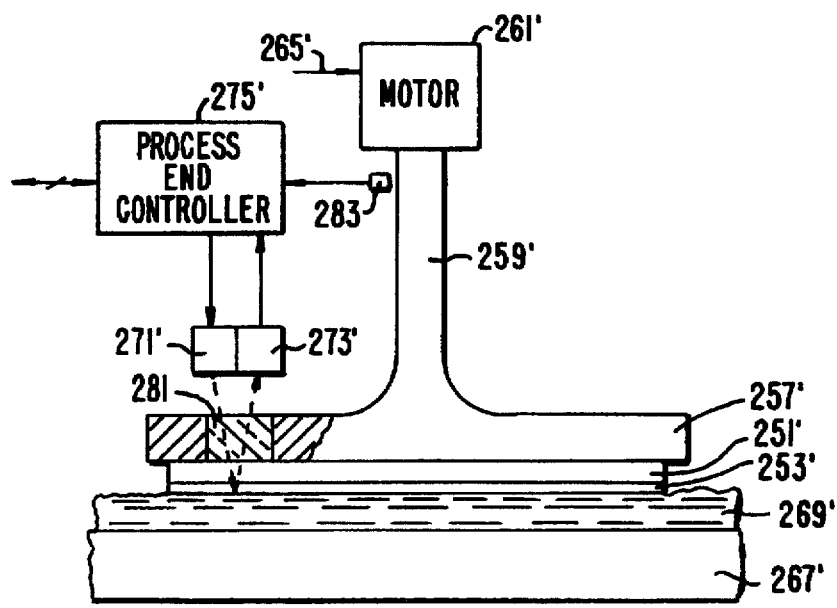

A very useful application of the apparatus of FIGS. 9 and 10 is in detecting when a surface of a layer has first been made planar by removal of its high spots or raised areas. A planarization step is often included in the course of processing integrated circuits and flat panel displays. After several process steps have formed various patterned dielectric and conductive layers, an uneven topology generally results. In many cases, it is desired to planarize this surface before the formation of additional operative layers. In order to accomplish this, a dielectric is usually deposited over the rough surface with a thickness greater than required, since its resulting surface is also uneven. That uneven surface is then mechanically planarized by removing the high spots of the deposited material. Later processing steps then form additional operative layers on this smooth surface.

Referring to FIGS. 11–14, a planarization operation is described. In the cross-sectional view of FIG. 11, a substrate 301 usually has other structure, indicated by a layer 303, formed on the substrate 301 over which a patterned layer 305 of material is formed. Alternately, the patterned layer 305 may be formed directly on the substrate 301. In either case, a rough exposed surface results. A layer 307, often an insulating oxide layer, is then formed, often by deposition, on the exposed surface. This results in raised areas 309 to be formed in positions over the remaining portions of the patterned layer 305. A low point 311 exists between adjacent raised areas 309. It is desired to remove the raised areas 309 to form a planar surface at a location indicated by a dashed line 313 that results in as little material of the layer 307 being removed from the region 311 as practical.

Figure 11:
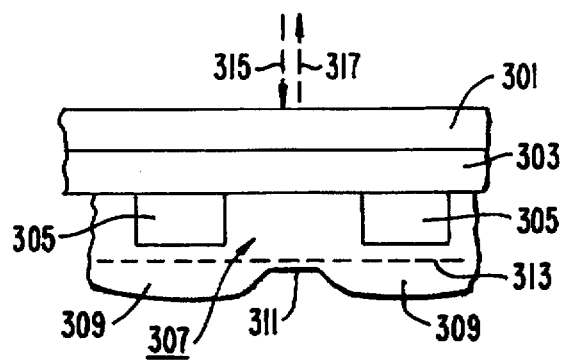
FIG. 11 is a cross-sectional view of an example structure being planarized by either of the configurations of FIGS. 9 or 10.

Determining such an endpoint of the planarization process is accomplished by directing a beam 315 of visible or near visible electromagnetic radiation against a backside of the substrate 301. In this case, the beam 315 is preferably directed perpendicularly against the substrate and a return beam 317 reflected from the various surfaces of the structure of FIG. 11 is the result. The beam 317 passes through the intermediate layer 303 on its way to the layer 307 being monitored, with the same potential effects as previously described with respect to the layers 223 and 223' of FIGS. 5 and 6. The reflected radiation beam 317 is directed onto a photodetector.

Figure 12:
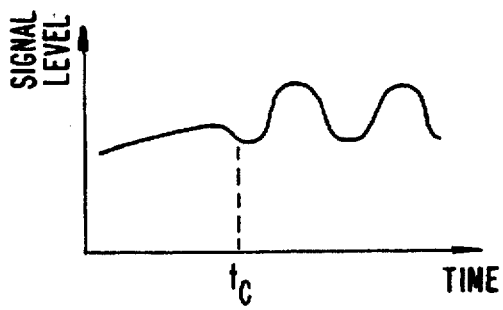
FIGS. 12 and 13 illustrate two alternative time domain signals that may be detected during planarization of the structure of FIG. 11.

FIG. 12 shows a component of a photodetector output signal that results from the beam 315 being reflected from only the portion 311 of the layer 307 being planarized. The signal of FIG. 12 is nearly constant during the time that the raised areas 309 are being removed, but begins at time $t_C$ to have a cyclic variation. This is the time when the surface 311 begins to experience substantial film removal. This cyclic variation results from an interference at the photodetector of a portion of the light beam 315 being reflected from the surface 311 and a portion being reflected from an opposite surface of the layer 307.

Figure 13:
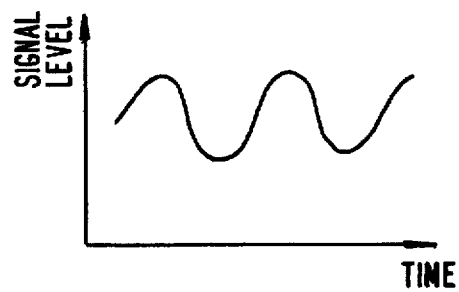

Of course, it is difficult to confine observation with the beam 315 to the region 311, primarily because of a finite angular divergence of the beam. Even when the material of the patterned layer 305 is substantially opaque to the light beam 315, the returning light beam signal 311 also observes a changing surface as the raised areas 309 are removed. A component of the reflected signal 315 from the raised 309 is shown in FIG. 13. That is, as the surfaces of the raised areas 309 are removed, a standard interference signal results from those regions. A single photodetector output signal is a combination of the signals of FIGS. 12 and 13, since signals from both the raised areas 309 and the surface 311 are combined. An endpoint is detected from this combined signal when it is detected that a change occurs as a result of the commencement of material being removed from the regions 311 between the raised areas 309.

Figure 14A:
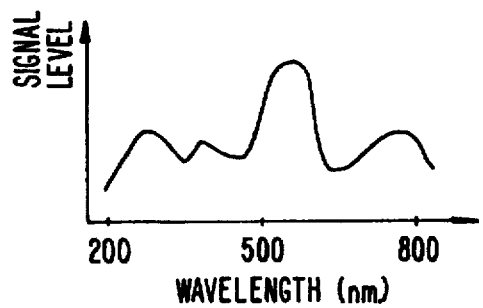
FIGS. 14A and 14B illustrate wavelength domain signals that may be detected at different times during planarization of the structure of FIG. 11.
Figure 14B:
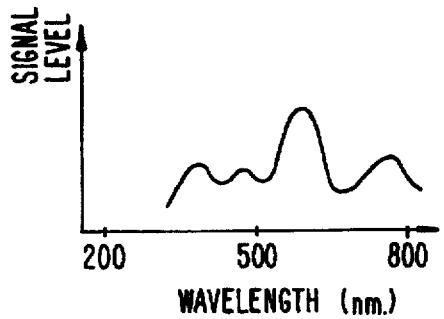

Rather than analyzing a returning signal of fixed optical wavelength as a function of time, as expressed with respect to FIGS. 12 and 13, an analysis of signal vs. wavelength (at various stages of the process) may be performed, as illustrated in FIGS. 14A and 14B. In this case, a broad spectrum radiation source is used for the beam 315 of FIG. 11, such as available from a white light source. A wavelength spectrum of the returning reflected light beam 317 is then periodically analyzed. Examples of such a wavelength spectrum at different points in the planarization process are shown in FIG. 14A and 14B. A detectable difference occurs when material has begun to be removed from the regions 311 between the raised areas 309.

Although this planarization monitoring technique is being described in the environment of a real time, through the substrate type of system, it can also be applied when the front side of the structure is illuminated by the beam. In a chemical-mechanical material removal process of the type illustrated with respect to FIGS. 9 and 10, such front side observation is not practical unless theblock 267 and abrasive fluid 269 are first removed from the structure being worked upon. This is of course, inconvenient, but may be practical in certain circumstances. Indeed, most all of the techniques being described in the present application, although preferred to be implemented by viewing from the back side of the wafer so that the processing operations may be monitored in real time, they can alternatively be performed from the front side of the wafer.

Figure 15A:
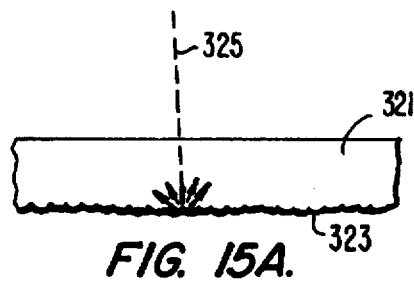
FIGS. 15A and 15B illustrate optically monitoring the roughness of a surface from the backside of the substrate.
Figure 15B:
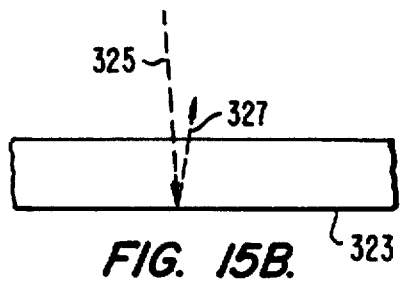
Figure 16:
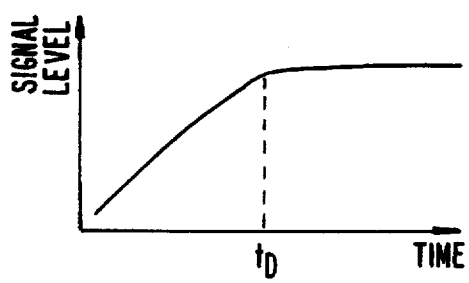
FIG. 16 shows an example signal obtained during polishing the surface of FIG. 15A by either of the configurations of FIGS. 9 or 10.

Use of the apparatus of FIGS. 9 and 10 and the techniques therein to monitor the polishing of a surface will now be described, initially with respect to FIGS. 15 and 16. Referring initially to FIG. 15A, a substrate 321 has a rough surface 323 that is desired to be made smooth by polishing. A light beam 325 passing from an opposite side of the substrate 321 is scattered by the light diffusive nature of the surface 323. The process now being described operates when the roughness of the surface 323 has a high enough spatial frequency that it tends to scatter the wavelength or wavelength range of the incident electromagnetic beam 325. When the surface 323 is polished smooth, as shown in FIG. 15B, it becomes specularly reflective and a reflected portion 327 of the incident beam 325 is directed onto a photodetector.

Figure 17:
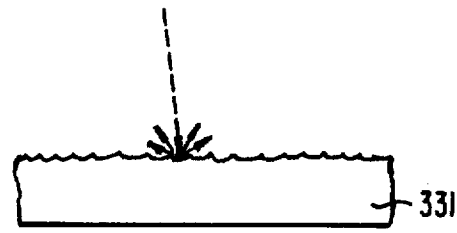
FIG. 17 illustrates optically monitoring the roughness of a surface from that surface's side of the substrate.

The photodetector is positioned to receive the reflected beam 327, although before the surface 323 is polished smooth it will receive only a very small portion of the incident beam 325 since that beam is scattered in many directions. FIG. 16 shows a typical output of such a photodetector. At the beginning, when the surface 323 is still rough and widely diffusing the incident radiation beam 325, the signal is low. But as the surface 323 becomes smoother through the polishing process, the signal increases until, at a time $t_D$, the output signal remains constant over time. It is that time $t_D$ that the surface 323 has been made as smooth as it is going to be and further polishing does not improve the characteristics of the surface. Further polishing only reduces the thickness of the substrate 321, which is generally undesirable. Although this technique has been described for polishing a substrate directly, it can, of course, also apply to a process of polishing a free surface of a structure formed on a substrate. Also, this technique may be utilized by directing a beam directly onto a rough surface of the substrate 331, as shown in FIG. 17, without passing through the substrate.

Figure 18:
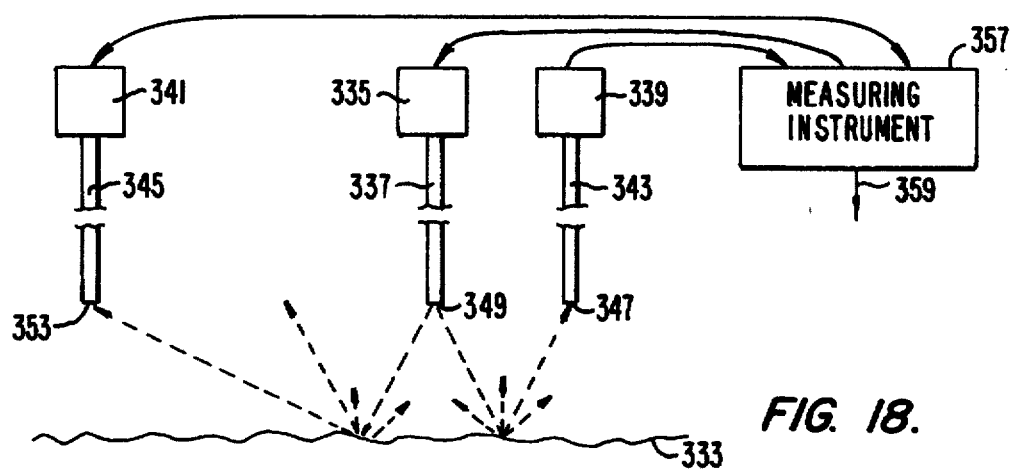
FIG. 18 is a schematic diagram of a light scattering detection system that is useful to monitor a polishing operation or otherwise determine a degree of surface roughness.

A technique of more accurately determining the endpoint of a polishing operation is shown in FIG. 18. A rough surface 333 is being polished. A radiation source 335 directs its output through an optical fiber 337 or other light pipe against the surface 333. The radiation may be directed either from the back side of the substrate on which the surface 333 exists, and thus pass through that substrate, or may alternatively be directed against the rough surface 333 directly without passing through the substrate.

In the embodiment of FIG. 18, two photodetectors 339 and 341 are positioned to receive light reflected from the surface 333. Although various optical systems can be employed, the use of respective optical fibers 343 and 345 are shown in FIG. 18 for gathering light onto their respective photodetectors 339 and 341. A light gathering end 347 of the optical fiber 343 is positioned with respect to a light emitting end 349 of the optical fiber 337 so as to receive its strongest radiation signal when the surface 333 has been polished smooth. This is similar to the photodetector described with respect to FIGS. 15 and 16, wherein an output signal of the photodetector 339 takes a shape of a curve 351 of FIG. 19 that is similar to the curve of FIG. 16. When the surface 333 is rough, the photodetector 339 receives a low signal since radiation from the fiber end 349 is scattered by the surface 333 in a number of directions. However, as the surface 333 becomes smoother, more of the light is reflected into the fiber end 347.

Figure 19:
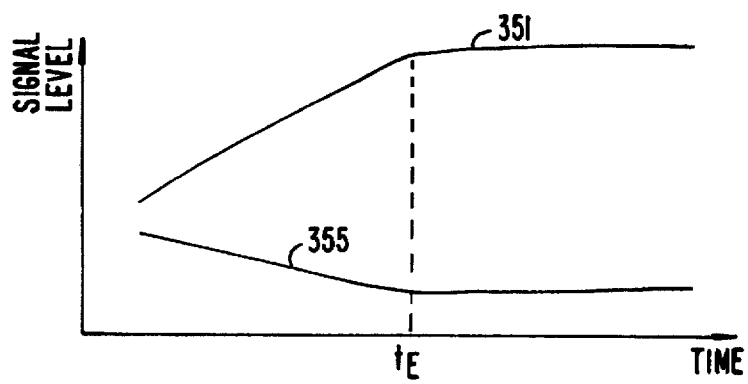
FIG. 19 illustrates signals obtained by the system of FIG. 18.

A radiation gathering end 353 of the fiber 345, on the other hand, is positioned a distance from the light source fiber end 349 so as not to receive a strong reflected component as the surface 333 is made smooth. Rather, an output signal of its photodetector 341, as illustrated by a curve 355 of FIG. 19, is its highest when the surface 333 is the roughest. That is because the fiber end 353 is positioned to receive its strongest signal when the surface 333 is scattering the incident radiation a maximum amount. Thus, as the surface 333 becomes smoother, as shown by curve 355, a signal output of the photodetector 341 decreases until the polishing is completed, at which time it remains at a constant very low level. By use of the two photodetectors 339 and 341, confirmation can be obtained at time $t_E$ that the surface 333 has been made as smooth as it is going to be made with the particular polishing materials being used. A measuring instrument 357 produces at an output 359 an indication when time $t_E$ has occurred by monitoring the slope of the curves 351 and 355.

As an alternative to monitoring optical characteristics of the surface being worked upon, the temperature is monitored of that surface, the surrounding substrate, abrasive slurry, or the like, in order to determine when the planarization or polishing operation has reached an endpoint. As part of both the planarization and polishing processes, heat is generated from the frictional removal a part of the surface. But when that surface becomes planar or smooth, the amount of heat being generated drops significantly, thus causing its temperature to follow. Although there are many ways of measuring an appropriate temperature in either of these processes, an optical technique is preferred.

Figure 20:
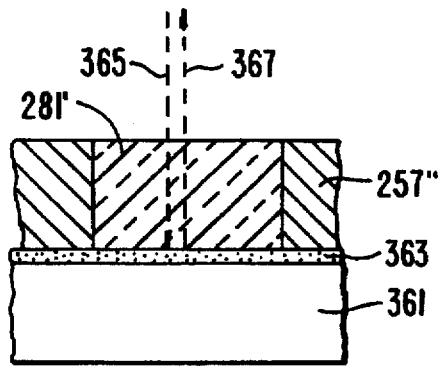
FIGS. 20 and 21 show two ways of monitoring the temperature of a substrate being processed by one of the configurations of FIGS. 9 or 10.

Referring to FIG. 20, a substrate 361 is coated with a layer 363 of a luminescent material. A beam 365 provides repetitive pulses of radiation that causes the luminescent material and the layer 363 to luminesce. A luminescent optical signal beam 367 is emitted and detected. Both of the beams 365 and 367 are passed through a transparent window 281' within a supporting, rotating wheel 257". The luminescent material in the layer 363 is chosen to have a decay time which various as a function of temperature. Such temperature measurement systems are well known, the disclosures of U.S. Pat. Nos. 4,652,143 and 5,107,445 being exemplary. Additionally, materials and systems for such measurements are available from Luxtron Corporation, assignee of the present application. The disclosure of the foregoing two patents are incorporated herein by this reference.

Figure 21:
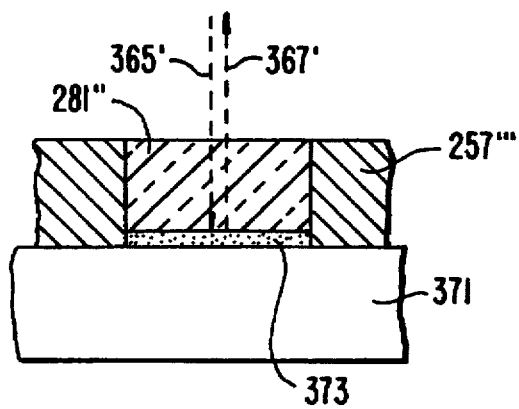
Figure 22:
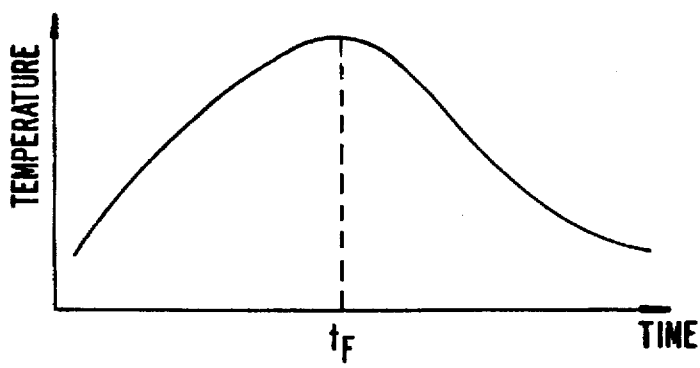
FIG. 22 illustrates a temperature signal obtained by the techniques of FIGS. 20 or 21.

Referring to FIG. 21, a substrate 371 having a surface being planarized or polished does not contain a coating of luminescent material. Rather such a layer 373 is permanently attached across a portion or all of a window 281" in the rotating support wheel 257"'. In either case, heat is transferred from the back of the substrate to the luminescent material layer in contact with it. As represented by the curve of FIG. 22, a planarization or polishing operation causes the temperature of the substrate to increase from the heat generated from the process. That temperature increases from an ambient temperature to some peak temperature at time $t_P$, after which it declines again toward the ambient temperature. The endpoint of the planarization or polishing operation has occurred shortly before time $t_F$ when the heat generating friction has been reduced by the surface being processed having become planar or smooth.

As an alternative to the luminescent temperature measuring technique, a pyrometer like technique described in U.S. Pat. No. 5,154,512 may be employed. By that technique, an emissivity corrected temperature reading is obtained of an exposed surface that is heated to a level sufficient that its blackbody radiation emissions may be detected. Since this technique also measures surface emissivity, characteristics of a film on the substrate surface may also be monitored, as described in U.S. Pat. No. 5,166,080. When a film is of a material that has a different emissivity than its supporting substrate or other structure, changes in its thickness or removal of portions of it will effect a composite reading of the emissivity of both the substrate and film. This changing composite emissivity can be used to detect process endpoints. The disclosures of these two patents are expressly incorporated herein by this reference.

Although the present invention has been described with respect to its preferred embodiments, it should be understood that the invention is entitled to protection within the full scope of the appended claims.

It is claimed:

1. A process of planarizing or polishing a first side of a structure, comprising the steps of:

holding the structure by contact with a second side thereof, moving the first side of said substrate across an abrasive medium, optically monitoring a temperature of the structure, and detecting from changes in said temperature when said planarizing or polishing process is completed.

2. A method of determining an endpoint in a process of polishing a surface from a rough state into a smooth state, comprising the steps of:

directing a radiation beam against said surface in a manner to be scattered thereby when in the rough state and reflected thereby when in the smooth state, positioning light gathering optics with respect to the surface and the radiation beam directed thereagainst in order to receive the beam reflected from the surface when the surface is in the smooth state, during the polishing process, monitoring as a function of time an intensity level of said received beam reflected from the surface, and determining from the intensity level of the received reflective beam as a function of time when the polishing has reached a desired level of completion.

3. The method according to claim 1 which comprises the additional steps of:

positioning second light gathering optics with respect to the surface and the radiation beam directed thereagainst in order to receive a portion of the beam scattered from the surface when the surface is in the rough state but substantially none of the beam from the surface when the surface is in the smooth state, during the polishing process, monitoring an intensity level of said beam portion scattered from the surface, and determining when the intensity level of the received scattered beam portion stops dropping, thereby to determine that the polishing is complete.

4. During a process of chemically and mechanically removing material from a surface of a front side of a substrate that has a back side held by a first member and the front side surface urged against a second member with an abrasive slurry therebetween while relative motion is imparted to the first and second members, a method of monitoring the material removal process, comprising:

directing radiation through the first member against the back side of the substrate, said radiation including a wavelength to which the substrate is transparent, said radiation thereby passing through said substrate to its front side, detecting a portion of said radiation that is reflected from the substrate front side and travels back through the substrate and the first member, and monitoring the detected radiation portion, thereby to monitor the material removal process as it is occurring.

5. The method of claim 4 wherein the process is removing material from a layer carried by the front side of the substrate, and the monitoring method monitors the removal of such material from the layer.

6. The method of claim 5 which additionally comprises identifying a characteristic of the monitored detected radiation portion that corresponds to the existence of a particular condition of the material removal process.

7. The method of claim 6 wherein the process includes removing material from a layer of material that is opaque to said radiation, and wherein the characteristic recognized is the total removal of the layer across at least a portion of a surface area of the layer.

8. The method of claim 6 wherein the process includes removing material from a layer of material that is transparent to said radiation, and wherein the characteristic recognized is the total removal of the layer across at least a portion of a surface area of the layer.

9. The method of claim 6 wherein the process includes removing material from a layer of material that is transparent to said radiation, and wherein the monitoring of the detected radiation includes monitoring a varying intensity of an interference between two portions of the detected radiation, one of said portions being reflected from an outer surface of the layer, and recognizing from the varying intensity a change in thickness of the layer.

10. The method of claim 6 wherein the identified characteristic of the monitored detected radiation portion includes a rapid change in a level of intensity of the detected radiation portion.

11. The method of claim 6 wherein the identified characteristic of the monitored detected radiation portion includes a change in a periodically varying intensity of the detected radiation portion.

12. The method of claim 11 wherein the change in the periodically varying intensity of the detected radiation portion being monitored is a cessation of periodic variations in the intensity of the detected radiation portion.

13. The method of claim 6 wherein the radiation directed against the substrate includes multiple wavelengths of radiation and the identified characteristic of the monitored detected radiation portion includes a wavelength spectrum of the detected radiation portion.

14. The method according to any one of claims 4–6 wherein the radiation includes electromagnetic radiation that is passed through the first member by way of an optical element carried by the first member.

15. The method according to any one of claims 6–13 which additionally comprises, in response to an identification of said characteristic, of changing some aspect of the material removal process.

16. The method according to any one of claims 4–13 wherein the process is removing material from a semiconductor wafer as the substrate.

17. The method according to any one of claims 4–13 wherein the process is removing material from a flat panel display as the substrate.

18. A process of chemically and mechanically removing material from a layer of opaque material carried by a front side of a substrate in the form of either a semiconductor wafer or a flat panel display, wherein the substrate has a back side held by a carrier and the layer urged against a polishing block with an abrasive slurry therebetween while relative motion is imparted between the carrier and the polishing block, wherein the removal of material is monitored in real time by a method comprising:

directing a beam of radiation through the carrier against the back side of the substrate, said radiation including a wavelength to which the substrate is transparent, said radiation thereby passing through said substrate to said layer, detecting a portion of said radiation that is reflected from the layer and travels back through the substrate and the carrier, monitoring the level of the detected radiation portion, thereby to monitor the material removal process as it is occurring, and identifying a characteristic of the monitored detected radiation portion that corresponds to the existence of a particular condition of the material removal process.

19. The process of claim 18 wherein the characteristic that is identified corresponds to the existence of a total removal of the layer across at least a portion of a surface area thereof.

20. The process of claim 19 additionally comprising, in response to the identification of the total removal of the layer across at least a portion of a surface area thereof, termination of any further removal of material from the layer.

21. The method of claim 18 wherein the identified characteristic of the monitored detected radiation portion includes a rapid change in a level of intensity of the detected radiation portion.

22. The process according to any one of claims 18–21 wherein the radiation is electromagnetic radiation that is passed through the carrier by way of an optical element carried by the carrier.

23. The process according to claim 22 wherein the optical element is held in contact with the back side of the substrate.

24. The process according to any one of claims 18–21 wherein at least the carrier is rotated during the process.

25. A process of chemically and mechanically removing material from a layer of transparent material carried by a front side of a substrate in the form of either a semiconductor wafer or a flat panel display, wherein the substrate has a back side held by a carrier and the layer urged against a polishing block with an abrasive slurry therebetween while at least the carrier is moved with respect to the polishing block, wherein the removal of material is monitored in real time by a method comprising:

directing a beam of radiation through the carrier against the back side of the substrate, said radiation including a wavelength to which the substrate is transparent as well as said layer, said radiation thereby passing through said substrate to said layer and portions thereof being partially reflected from various interfaces and back through the substrate and the first member, detecting at least two of said reflected radiation portions, one of which is reflected from an exterior surface of the layer, said radiation detection occurring after the radiation has traveled from the layer back through the substrate and the first member, monitoring a resulting interference between the detected at least two of said reflected radiation portions, thereby to optically monitor progress of the removal of material from the layer, and identifying a characteristic of the monitored radiation interference that corresponds to the existence of a particular condition of the material removal process.

26. The process of claim 25, additionally comprising, in response to detecting said characteristic, generating a signal.

27. The process of claim 26, additionally comprising, in response to the signal, of altering the material removal process.

28. The process of claim 27 wherein altering the material removal process includes terminating further removal of material from the layer.

29. The method of claim 25 wherein the identified characteristic of the monitored interference includes a change in a periodically varying intensity of the interference.

30. The method of claim 29 wherein the change in the periodically varying intensity of the interference being monitored is a cessation of periodic variations in the intensity of the interference.

31. The process according to any one of claims 25–30 wherein the radiation is electromagnetic radiation that is passed through the carrier by way of an optical element carried by the carrier.

32. The process according to claim 31 wherein the optical element is held in contact with the back side of the substrate.

33. In a chemical-mechanical planarization apparatus that includes a carrier with a surface capable of holding a backside of a substrate thereagainst and which provides relative movement of a front side of the substrate against a polishing block with an abrasive slurry therebetween, a system that monitors removal of material from the front side of the substrate, said system comprising:

a source of electromagnetic radiation, at least one optical element that is transparent to said radiation and which is embedded in the surface of said carrier in a position adjacent a backside of a substrate carried thereby, an optical system positioned to direct said radiation through the optical element and a substrate held against the carrier surface, a photodetector positioned to receive, through said at least one optical element, radiation that is reflected from a front side of said substrate, thereby to generate an electrical signal related to the reflected radiation, means receiving the electrical signal for identifying a particular characteristic of the electrical signal that corresponds to a predefined condition of the wafer front side, and means responsive to an identification of the particular characteristic for changing some aspect of operation of the apparatus.

34. The system of claim 33 wherein the characteristic identifying means includes means for identifying an end point of the processing and the operation changing means includes means for terminating operation of the apparatus.

35. A method of monitoring the removal of material from an exterior surface having adjacent raised and depressed areas thereacross, said exterior surface being on a layer carried by a substrate, comprising:

directing electromagnetic radiation through boundary surfaces of said substrate and layer to said exterior surface in a manner to be partially reflected from the boundary surfaces, the exterior surface raised areas, and the exterior surface depressed areas, detecting the radiation after it is partially reflected from various ones of the boundary and exterior surface areas and after said partially reflected radiation has passed back through and exits the substrate, and monitoring, during removal of material from said exterior surface, an interference between said partial radiation reflections, thereby to optically monitor progress of removal of material from the exterior surface.

36. The method according to claim 35 wherein material is removed from the exterior surface by holding the substrate of the layered structure in a manner to position the exterior surface against a polishing block with a chemical-mechanical slurry therebetween, and providing relative motion between said exterior surface and the polishing block.

37. The method according to claim 35 wherein monitoring the interference includes monitoring an alternating intensity resulting from interference between the partial reflections from the exterior surface and at least one of the boundary surfaces.

38. The method according to claim 35 which additionally comprises detecting a characteristic of the intensity component being monitored and, in response to detecting said characteristic, altering the material removal process on said layer exterior surface.

39. A method of planarizing an exterior surface having adjacent raised and depressed areas thereacross, said exterior surface being on a layer carried by a substrate, comprising:

removing material from the exterior surface, directing electromagnetic radiation through boundary surfaces of said substrate and layer to said exterior surface in a manner to be partially reflected from both the boundary surfaces and a region of the exterior surface including both raised and depressed areas, detecting the radiation that is partially reflected from the boundary and exterior surfaces after said partially reflected radiation exits the substrate, and monitoring a component of the partially reflected radiation that varies in intensity, during removal of material from said exterior surface, as a result of interference between reflections from the exterior surface and at least one of the boundary surfaces, thereby to optically monitor progress of the exterior surface planarization.

40. The method according to claim 39 wherein material is removed from the exterior surface by holding the substrate of the layered structure in a manner to position the exterior surface against a planar surface with an abrasive material therebetween, and providing relative motion between said exterior and planar surfaces.

41. The method according to claim 39 wherein monitoring the reflected radiation includes monitoring an alternating intensity component resulting from interference between reflections from the exterior surface and at least one of the boundary surfaces.

42. The method according to claim 41 wherein the alternating intensity component results primarily from interference with reflections from the raised areas of the exterior surface.

43. The method according to claim 41 wherein the alternating intensity component results primarily from interference with reflections from the depressed areas of the exterior surface.

44. The method according to claim 39 wherein monitoring a component of the reflected radiation includes primarily monitoring an intensity component resulting from interference with reflections from the raised areas of the exterior surface.

45. The method according to claim 39 wherein monitoring an component of the reflected radiation includes primarily monitoring an intensity component resulting from interference with reflections from the depressed areas of the exterior surface.

46. The method according to claim 39 which additionally comprises detecting a characteristic of the intensity component being monitored and, in response to detecting said characteristic, altering the material removal process on said layer exterior surface.

\* \* \* \* \*